(12) United States Patent
Lewis et al.

(10) Patent No.: US 7,432,734 B2
(45) Date of Patent: Oct. 7, 2008

(54) VERSATILE LOGIC ELEMENT AND LOGIC ARRAY BLOCK

(75) Inventors: David M. Lewis, Toronto (CA); Paul Leventis, Toronto (CA); Andy L. Lee, San Jose, CA (US); Henry Kim, San Jose, CA (US); Bruce Pedersen, San Jose, CA (US); Chris Wysocki, Toronto (CA); Christopher F. Lane, San Jose, CA (US); Alexander Marquardt, Toronto (CA); Vikram Santurkar, San Jose, CA (US); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/743,625

(22) Filed: May 2, 2007

(65) Prior Publication Data
US 2007/0252617 A1 Nov. 1, 2007

Related U.S. Application Data

(62) Division of application No. 11/050,111, filed on Feb. 2, 2005, now Pat. No. 7,218,133, which is a division of application No. 10/280,723, filed on Oct. 24, 2002, now Pat. No. 6,937,064.

(51) Int. Cl.
*H01L 25/00* (2006.01)
*H03K 19/177* (2006.01)

(52) U.S. Cl. ................................. 326/41; 326/39; 326/47

(58) Field of Classification Search .................... 326/39, 326/41, 47
See application file for complete search history.

(56) References Cited

U.S. PATENT DOCUMENTS 4,706,216 A 11/1987 Carter (Continued)

OTHER PUBLICATIONS

Lane et al., U.S. Appl. No. 10/159,581, filed May 30, 2002.

(Continued)

*Primary Examiner*—Anh Q Tran
(74) *Attorney, Agent, or Firm*—Weaver Austin Villeneuve & Sampson LLP

(57) ABSTRACT

An embodiment of this invention pertains to a versatile and flexible logic element and logic array block ("LAB"). Each logic element includes a programmable combinational logic function block such as a lookup table ("LUT") and a flip-flop. Within the logic element, multiplexers are provided to allow the flip-flop and the LUT to be programmably connected such that either the output of the LUT may be connected to the input of the flip-flop or the output of the flip-flop may be connected to the input of the LUT. An additional multiplexer allows the output of the flip-flop in one logic element to be connected to the input of a flip-flop in a different logic element within the same LAB. Output multiplexers selects between the output of the LUT and the output of the flip-flop to generate signals that drive routing lines within the LAB and to routing lines external to the LAB. These output multiplexers are constructed such that the combinational output (output from the LUT) is faster than the output from the flip-flop. A collection of routing lines and multiplexers within the LAB are used to provide inputs to the LUTs. Each of the input multiplexers for each logic element is connected to a subset of the routing lines within the LAB using a specific pattern of connectivity of multiplexers to associated wires that maximizes the efficiency of use of the routing wires. Control signals for the set of logic elements within the LAB are generated using a secondary signal generation unit that minimizes contention for shared signals. One of the control signals is an "add-or-subtract control signal" that allows all of the LEs in a LAB to perform either addition or subtraction under the control of a logic signal. In a PLD supporting redundancy, the carry chain for the LABs is arranged in the same direction that redundancy shifts to remap defective LABs and a multiplexer on the carry input of a LAB is used to select the appropriate carry output from another LAB depending on whether redundancy is engaged.

14 Claims, 6 Drawing Sheets

U.S. PATENT DOCUMENTS

| | | |
|---|---|---|
| 4,758,985 A | 7/1988 | Carter |
| 5,260,610 A | 11/1993 | Pedersen et al. |
| 5,331,226 A | 7/1994 | Goetting |
| 5,352,940 A | 10/1994 | Watson |
| 5,399,922 A | 3/1995 | Kiani et al. |
| 5,438,295 A | 8/1995 | Reddy et al. |
| 5,488,316 A | 1/1996 | Freeman et al. |
| 5,682,107 A * | 10/1997 | Tavana et al. ............. 326/41 |
| 5,689,195 A | 11/1997 | Cliff et al. |
| 5,815,003 A | 9/1998 | Pedersen |
| 5,821,773 A | 10/1998 | Norman et al. |
| 5,831,448 A | 11/1998 | Kean |
| 5,835,998 A | 11/1998 | Pedersen |
| 5,920,202 A | 7/1999 | Young et al. |
| 5,923,185 A | 7/1999 | Zhou |
| 5,953,537 A | 9/1999 | Balicki et al. |
| 5,999,015 A | 12/1999 | Cliff et al. |
| 5,999,016 A | 12/1999 | McClintock et al. |
| 6,020,756 A | 2/2000 | New |
| 6,034,540 A | 3/2000 | Mendel |
| 6,051,992 A | 4/2000 | Young et al. |
| 6,066,960 A | 5/2000 | Pedersen |
| 6,069,487 A | 5/2000 | Lane et al. |
| 6,084,427 A | 7/2000 | Lee et al. |
| 6,107,822 A | 8/2000 | Mendel et al. |
| 6,118,300 A | 9/2000 | Wittig et al. |
| 6,122,720 A | 9/2000 | Cliff |
| 6,124,731 A | 9/2000 | Young et al. |
| 6,167,558 A | 12/2000 | Trimberger |
| 6,184,707 B1 | 2/2001 | Norman et al. |
| 6,191,610 B1 | 2/2001 | Wittig et al. |
| 6,201,404 B1 | 3/2001 | Reddy et al. |
| 6,201,410 B1 | 3/2001 | New et al. |
| 6,211,696 B1 | 4/2001 | Skahill et al. |
| 6,249,149 B1 | 6/2001 | Pedersen |
| 6,255,846 B1 | 7/2001 | Lee et al. |
| 6,271,680 B1 | 8/2001 | Mendel et al. |
| 6,275,065 B1 | 8/2001 | Mendel |
| 6,323,677 B1 | 11/2001 | Lane et al. |
| 6,323,682 B1 | 11/2001 | Bauer et al. |
| 6,344,755 B1 | 2/2002 | Reddy et al. |
| 6,362,648 B1 | 3/2002 | New et al. |
| 6,380,759 B1 * | 4/2002 | Agrawal et al. ............ 326/41 |
| 6,400,180 B2 | 6/2002 | Wittig et al. |
| 6,965,249 B2 | 11/2005 | Lane et al. |
| 6,970,014 B1 | 11/2005 | Lewis et al. |
| 7,180,324 B2 | 2/2007 | Chan et al. |

OTHER PUBLICATIONS

Lewis et al., U.S. Appl. No. 11/684,424, filed Mar. 9, 2007.
"The Stratix Architecture, Functional Description," pp. 2-1 through 2-140, from the Altera Corporation, Jul. 2005 (Altera Internal document No. S51002-3.2).
"The Stratix® PII Architecture, Functional Description," pp. 2-104, The Stratix® II Device handbook, vol. 1, Dec. 2005 (Altera Document No. SII51002-4.0).

* cited by examiner

Secondary Signal Generation Unit
375

VERSATILE LOGIC ELEMENT AND LOGIC ARRAY BLOCK

CROSS-REFERENCE TO RELATED APPLICATIONS

This application is a divisional of U.S. patent application Ser. No. 11/050,111, filed Feb. 2, 2005 now U.S. Pat No. 7,218,133, and entitled "VERSATILE LOGIC ELEMENT AND LOGIC ARRAY BLOCK," and which is related to U.S. application Ser. No. 10/280,723, filed Oct. 24, 2002, and entitled "VERSATILE LOGIC ELEMENT AND LOGIC ARRAY BLOCK," which issued on Aug. 30, 2005 as U.S. Pat. No. 6,937,064, and which are hereby incorporated by reference herein.

BACKGROUND OF THE INVENTION

1. Field of the Invention

This invention relates generally to a programmable logic device and, in particular, to a programmable logic device having versatile and efficient logic elements and logic array blocks.

2. Description of the Related Art

A programmable logic device ("PLD") is a digital, user-configurable integrated circuit used to implement a custom logic function. For the purposes of this description, the term PLD encompasses any digital logic circuit configured by the end-user, and includes a programmable logic array ("PLA"), a field programmable gate array ("FPGA"), and an erasable and complex PLD. The basic building block of a PLD is a logic element ("LE") that is capable of performing logic functions on a number of input variables. Conventional PLDs combine together large numbers of such LEs through an array of programmable interconnects to facilitate implementation of complex logic functions. PLDs have found particularly wide application as a result of their combined low up front cost and versatility to the user.

A variety of PLD architectural approaches arranging the interconnect array and LEs have been developed to optimize logic density and signal routability between the various LEs. The LEs are arranged in groups to form a larger logic array block ("LAB"). Multiple LABs are arranged in a two dimensional array and are programmably connectable to each other and to the external input/output pins of each LAB through horizontal and vertical interconnect channels.

The typical LAB within the PLD includes a set of LEs, routing lines, and multiplexers to provide inputs to the LEs and route outputs from the LEs to routing lines both within the LAB and outside the LAB. One type of routing lines are LAB lines which are within the LAB and are driven by a set of multiplexers that select from routing signals outside the LAB. Another type of routing lines are local lines which are within the LAB and carry signals that are generated by LEs within the LAB. A set of LE input multiplexers ("LEIMs") within the LAB programmably select signals from any one of the LAB lines or local lines. Each LE has associated with it one LEIM per input to the LE. In this case, referred to as a fully populated LAB, the LEIMs can programmable select a signal from all of the LAB lines and local lines. In another implementation, each LE has LEIMs divided into two groups. One group of LEIMs selects from one pool of LAB lines and local lines, and the second group of LEIMs selects from another pool of LAB lines and local lines. In the fully populated LAB, the large number of inputs to the LEIM results in a large size multiplexer which results in a PLD that requires more area and is slower.

An alternative to the fully populated LAB is a partially populated LAB. In the partially populated LAB, each LEIM has access to a subset of the LAB lines and local lines. However, this pattern of connections is constructed in a repeating form, such that the LAB lines may be divided into a small number of disjoint groups, with each group providing access to a specific subset of the pins on all LEs. For example, assuming that there are four LAB lines and each LE has four input pins labeled A, B, C, and D, a first group of half the LAB lines connect to input pins A and C on every LE, and a second group of the other half of the LAB lines connect to input pins B and D on every LE. This regular pattern facilitates implementation of the LEIMs, but at a cost in decreased routability. Routing signals that fan out to multiple LEs within a single LAB may result in contention for the input pins of the LEs and more LAB lines will have to be provided than that used with the fully populated LAB. Elaborating on the previous example to show contention, it may be desired to send a signal on a LAB line to pin A on one LE and to pin B on another LE. Since none of the LAB lines connect to both pins A and B (in this example, the LAB lines connect to pins A and C or pins B and D), two LAB lines are used in this case rather than a single LAB line. The greater the number of LAB lines used, the larger the size of the PLD and the greater the delay within the PLD. Increasing the number of LAB lines used also results in increased PLD cost.

In a fully populated LAB, each of the LEIMs provides programmable connections to all of the LAB lines and local lines within the pool resulting in the large number of inputs to the LEIM. With the partially populated LAB, the cost of the large number of inputs is somewhat reduced, but this reduction is mitigated by the need to increase the number of LAB lines and associated routing circuitry.

Each LE typically provides a combinational logic function such as a look-up table ("LUT"), and one or more flip-flops. The input of the flip-flop may programmably be selected to be either the output of the LUT, or one of the input pins of the LE. Other multiplexing circuits may exist to dynamically select between the output of the LUT and one of the inputs of the LE using other logic signals. For example, the APEX-20K can programmably be configured to load the flip-flops from the C input of the LE, or programmably be configured to select between one of the LE output, the LE input, and a ground signal under the dynamic control of the two signals "synchronous load" and "synchronous clear" which are distributed to all of the LEs in the LAB.

Each LE can programmably select the output of the LUT, which is the combinational output, or the output of the flip-flop, which is the registered output, as one of the outputs of the LE. One or more of these outputs will be driven onto the routing structures (e.g., driver input multiplexers ("DIMs") and drivers that drive the wires of a channel) outside the LABs. One or more of these outputs will also be driven onto the local lines of the LAB. For example, with the APEX-20K, the output may programmably be driven onto two distinct sets of local lines.

The multiplexers typically within the LE allow the LE to be programmably configured to perform a variety of useful functions. The LE may be configured to perform a combinational function in isolation. It may alternatively be configured to perform a combinational function feeding a flip-flop, and route either or both of the combinational and registered signal to the outputs. It may also be programmably configured to implement both a combinational function and an independent flip-flop, or a flip-flop that shares as its data input one of the inputs to the combinational function, or as a flip-flop in isolation. Finally, it may be programmably configured to select between the various data sources (combinational function, LE input, or logic 0) based on certain control signals.

The necessity of adding a multiplexer to select between the LUT and flip-flop adds delay to the circuit. This delay should be minimized to improve LE performance especially when the multiplexer is used within the critical path.

Current LEs provide the ability to use the flip-flop and the LUT as separate logic units within the LE, however, these are not completely independent. If the flip-flop has its input connected to signals that are distinct from any of those used by the LUT, then it uses one of the input connections to the LUT, reducing the number of connections available for the LUT. Similarly, if both the output from the LUT and the output from the flip-flop are used within a LE, there is only one local line connection that is available to route a signal from an output of that LE to inputs of other LEs within the LAB, so if both the output from the LUT and the output from the flip-flop need to drive an input of an LE within the LAB, then either the output of the flip-flop or the output of the LUT is routed outside the LAB to one of the LAB lines at a higher cost and logic delay. In addition, a LUT and a flip-flop may be merged (i.e., both included within a single LE) into a single LE only if the LUT output feeds the input of the flip-flop, or one of the inputs of the LUT is not used, or the signal driving the flip-flop is also connected to one of the LUT inputs.

In some LE architectures, a LUT having four inputs is implemented using two LUTs having three inputs of A, B, and carry_in. In these architectures, an arithmetic function of more than two data inputs (e.g., the data inputs "A" and "B") cannot be performed. For example, functions such as performing the addition or subtraction of the two data inputs under the control of another input cannot be performed.

For the foregoing reasons, it is desirable to have a PLD that includes versatile and efficient LEs and logic array blocks.

SUMMARY OF THE INVENTION

According to an embodiment of the present invention, a logic element is described. The logic element includes: (1) a logic function block having inputs and an output, (2) a storage unit having an input and an output, the input coupled to a particular one of logic element inputs and the output of the logic function block, the storage unit stores the particular one of the logic element inputs or the output of the logic function block, and (3) a first selection unit having a first input, a second input, and an output, the first input coupled to the output of the storage unit, the second input coupled to the particular one of the logic element inputs, and the output coupled to a particular one of the inputs of the logic function block corresponding to the particular one of the logic element inputs. The first selection unit select as the output any one of the inputs to the first selection unit.

DETAILED DESCRIPTION OF THE INVENTION

An embodiment of the invention pertains to programmably connecting the flip-flops and the LUTs within the LE to provide versatile and flexible connections both within the LE and between LEs in the same LAB. Each LEIM selects inputs from a subset of the routing lines within the LAB. The pattern of connections of routing lines to multiplexers is arranged to reduce the need for extra LAB lines by increasing the number of distinct groups of the LAB lines while still maintaining a regular structure that can be readily implemented in an integrated circuit.

Figure 1:
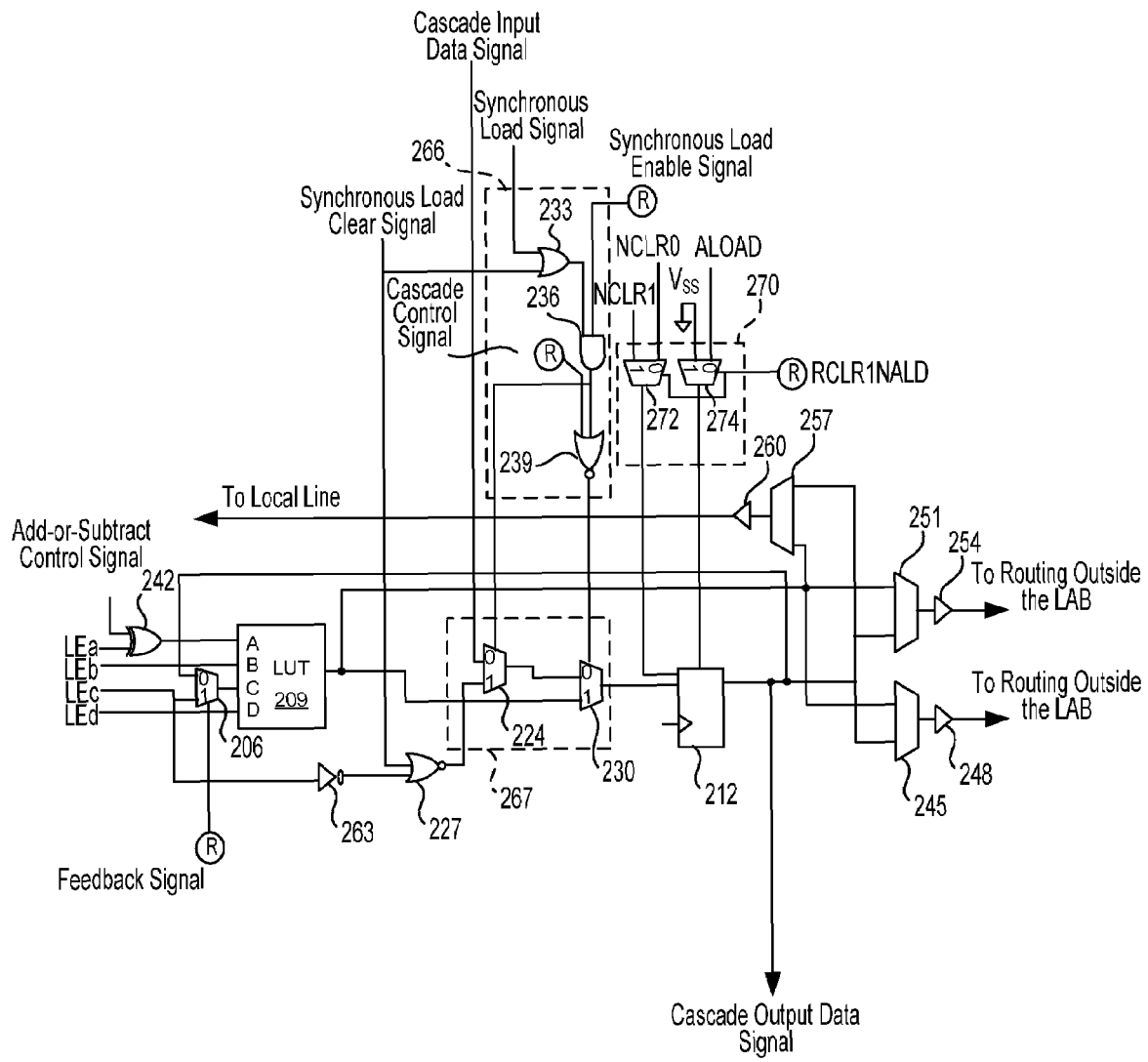
FIG. 1 shows an embodiment of a logic element according to the present invention.

FIG. 1 shows an embodiment of a LE 203 according to the present invention. A first aspect of this embodiment pertains to flexibly coupling a logic function block (e.g., combinational logic such as a LUT 209) and a storage unit (e.g., a register such as a flip-flop 212) within a single LE 203. A selection unit that selects one of its inputs as an output, such as a feedback multiplexer ("mux") 206, is programmably controlled by a "feedback signal". An output of the feedback mux 206 is coupled to an input "C" of the LUT 209. This is for example purposes and the feedback mux 206 can be coupled to other inputs of the LUT 209 depending on the combinational logic functions implemented by the LUT 209. In this embodiment, the LE 203 has four LE inputs provided by four LEIMs and these are labeled "LEa", "LEb", "LEc", and "LEd". One of the inputs to the feedback mux 206 is coupled to the LE input "LEc" and the other input to the feedback mux 206 is coupled to the output of the flip-flop 212. A "feedback signal" determines whether the feedback mux 206 selects as its output the LE input "LEc" or the output from the flip-flop 212. In one embodiment, the "feedback signal" is specified by a configuration bit which is typically set at the time the PLD is configured. In another embodiment, the "feedback signal" is a dynamic signal that is carried on, for example, a wire. If the output from the flip-flop 212 is selected and thus sent to the LUT 209, then the LE 203 is in a "quick feedback" mode. If the feedback mux 206 selects as its output the input "LEc", then the LUT 209 can access all of the LE inputs "LEa", "LEb", "LEc", and "LEd". If the feedback mux 206 selects as its output the output of the flip-flop 212, then the LUT 209 can access all the LE inputs except the input "LEc". In this case, the input "LEc" can be stored in the flip-flop 212. The LUT 209 can access the input "LEc" since in this case, the output of the flip-flop 212 is coupled to an input of the LUT 209.

Figure 4:
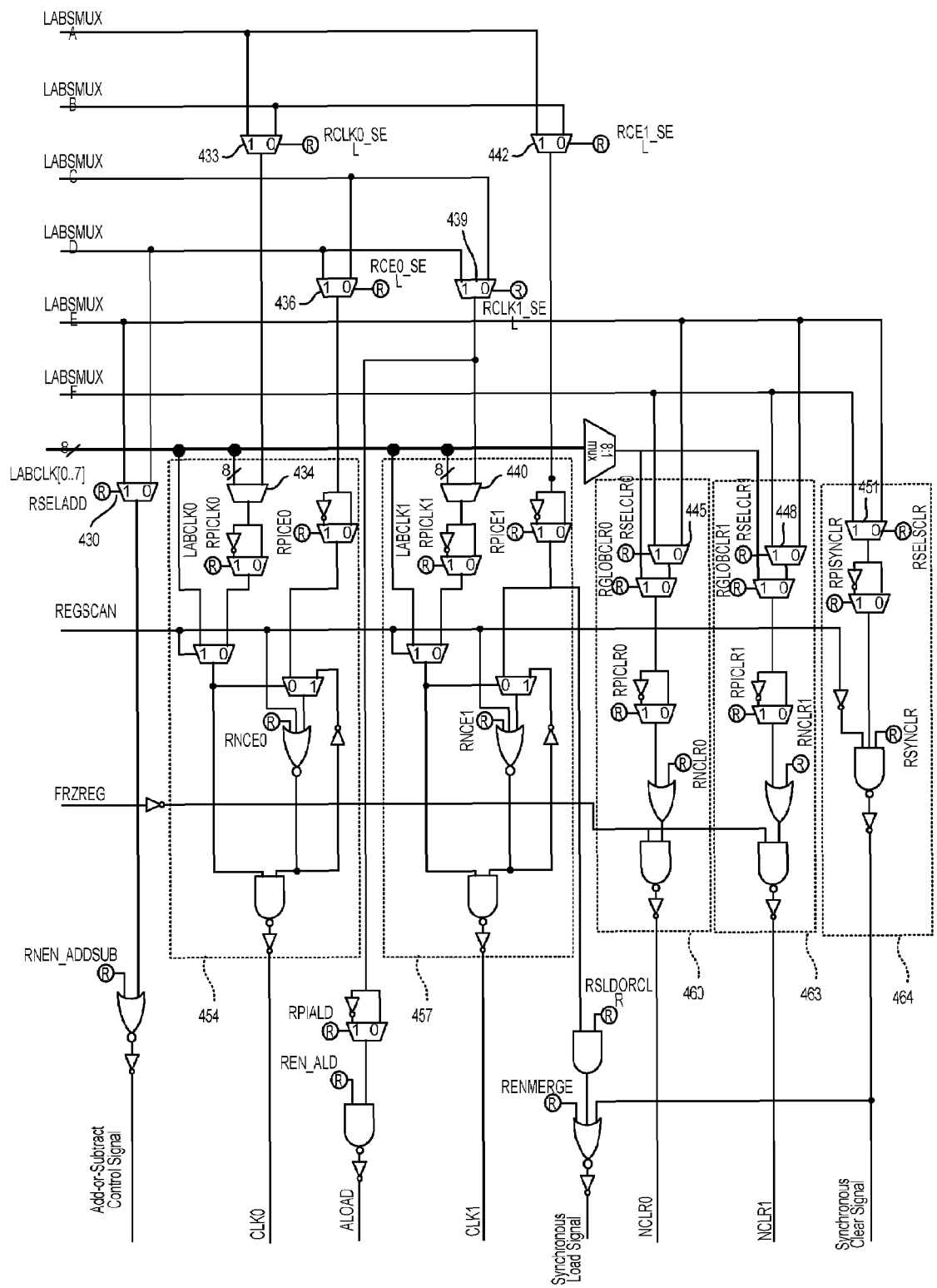
FIG. 4 shows an embodiment of a secondary signal generation unit according to the present invention.

When the flip-flop 212 is loaded with the input "LEc", the LE 203 is in a "packed register" mode. In the "packed register" mode, a "reemerge" signal shown in FIG. 4 is asserted. In the "packed register" mode, the input "LEc" is sent to an input of an inverter 263. The inverter 263 inverts the logic value of the input "LEc" and outputs this inverted value to one of the inputs of a logic gate, such as a NOR gate 227. Another input to the NOR gate 227 is a "synchronous clear signal" that indicates whether the flip-flop 212 should be synchronously cleared (e.g., whether the flip-flop should be loaded with the logic value "0").

In the "packed register" mode, the "synchronous clear signal" indicates whether the flip-flop 212 should be cleared, or whether it should instead be synchronously loaded from "LEc". When placed into "packed register" mode, if the "synchronous clear signal" is de-asserted (has a logic value "0"), the flip-flop 212 will not be synchronously cleared, and the output of the NOR gate 227 will be "LEc". This de-assertion of the "synchronous clear signal" also guarantees the output of the OR Gate 233 to be the same as the value of its other input, the "synchronous load signal". In order for the output of the AND Gate 236 to be asserted (have the logic value "1"), which will cause synchronous loading of the flip-flop 212 to occur, the output of the OR Gate 233 and the "synchronous load enable signal" must both be asserted (have the logic value "1"). The output of the AND Gate 236 is coupled to a control input of a selection unit, such as mux 224. Since the output of the AND gate 236 indicates that the LE 203 is in packed register mode, then mux 224 selects as its output, the output from the NOR gate 227 (e.g., the mux 224 is programmed such that it selects as its output the output of the NOR gate 227 if the control input has a logic value "1"). The output of the AND gate 236 is also sent to one of the inputs of another logic gate, such as NOR gate 239. The output of the NOR gate 239 is coupled to a control input of a selection unit, such as mux 230. Since the output of the AND gate 236 indicates that the LE 203 is in the packed register mode, the output of the NOR gate 239 indicates that the LE 203 is not in the normal mode. Since the control input of the mux 230 indicates that the LE 203 is not in the normal mode, the mux 230 selects as its output the output of the mux 224 (e.g., the mux 230 is programmed such that it selects as its output the output of the mux 224 if the control input has a logic value "0"). In this way, the flip-flop 212 is loaded with the LE input "LEc". By using the feedback mux 206 and by coupling the output of the flip-flop 212 to the feedback mux 206, the LUT 209 can be combined with a flip-flop associated either with one of the LE inputs (e.g., "LEa", "LEb", "LEc", or "LEd") or the output of the LE without using any external LAB lines or local lines while also allowing the LUT 209 to use all of the available LE inputs to implement the logic function.

A second aspect of this embodiment pertains to a register cascade mode where the output of a first flip-flop is loaded into the input of a second flip-flop within another LE without using a local line, an input pin of the other LE, or wires within a channel (e.g., there is a direct coupling between the output of the first flip-flop and the input of the second flip-flop). A PLD may include the flip-flop 212 within a first LE whose output feeds directly into the input of the flip-flop within a second LE to form a shift register as well as combinational logic that includes LEs that only fan out to other LEs. The mux 224 programmably allows the data input of the flip-flop 212 to be either a "cascade input data signal" or some other signal such as the LE input "LEc". The mux 224 selects the data to be stored in the flip-flop 212. The flip-flop 212 can be synchronously cleared under control of a "synchronous clear signal", regardless of the mode of the LE 203.

A "cascade input data signal" arrives from a first LE to the present LE 203 and a "cascade output data signal" which is the output of the flip-flop 212 of the LE 203 is sent to a second LE. The first LE and the second LE are, for example, physically adjacent to the present LE 203. By using the "cascade input data signal" and the "cascade output data signal", the output of the flip-flop within the first LE (i.e., the "cascade input data signal") can be stored in the flip-flop 212 of the present LE 203 and the output of the flip-flop 212 (i.e., the "cascade output data signal") can be stored in the flip-flop within the second LE.

The "cascade input data signal" is the data stored within the flip-flop of another LE and output by that LE. The "cascade control signal" indicates whether the LE 203 is in a cascade mode, i.e., whether to store within the flip-flop 212 the "cascade input data signal" output by the other LE. In one embodiment, the "cascade control" is specified by a configuration bit which is typically set at the time the PLD is configured. In another embodiment, the "cascade control signal" is a dynamic signal that is carried on, for example, a wire. A selection interface 267 within the LE 203 includes a mux 224 and a mux 230. The mux 224 has a first data input, a second data input, a control input, and an output. The first data input is coupled to the "cascade input data signal". The second data input is coupled to the output of a logic gate, such as a NOR gate 227.

For the mux 224, the control input is coupled to a first output of the synchronous signal processor unit 266 (the first output of the synchronous signal processor unit 266 is the output of the AND gate 236). When loading the "cascade input data signal" to the flip-flop 212, the "synchronous load enable signal" indicates that a synchronous operation is not to be performed (the "synchronous load enable signal" is not asserted, e.g., has a logic value "0"). This results in the output of the AND gate 236 indicating that it is not in a synchronous mode (the AND gate 236 is not asserted, e.g., has a logic value "0") when the "cascade input data signal" is to be loaded into the flip-flop 212. Since the output of the AND gate 236 indicates that it is not in the synchronous mode and this output controls the mux 224, the mux 224 selects the "cascade input data signal" as its output (in this embodiment, the mux 224 is programmed such that it selects the "cascade input data signal" as its output if the control input of the mux 224 has a logic value "0"). The output of the AND gate 236 is coupled to the second input of the NOR gate 239. The first input of the NOR gate 239 is coupled to the "cascade control signal". When in the register cascade mode, the "cascade control signal" indicates that the LE 203 is operating in the cascade mode (the "cascade control signal" is asserted, e.g., has a logic value "1"). These two inputs of the NOR gate 239 result in the output of the NOR gate 239 indicating that the LE 203 is not operating in the normal mode (the output of the NOR gate 239 is de-asserted, e.g., has a logic value "0"). The control input of the mux 230 is coupled to the output of the NOR gate 239. Since the control input of the mux 230 indicates that the LE 203 is not in the normal mode, the mux 230 selects as its output the output from the mux 224 (in this embodiment, the mux 230 is programmed such that it selects the output of the mux 224 if the control input of the mux 230 has a logic value "0"). When in the register cascade mode, the output of the mux 224 is the "cascade input data signal". The output of the mux 230 (the "cascade input data signal") is stored in the flip-flop 212.

The flip-flop 212 can be synchronously cleared in any of the modes that the flip-flop 212 is operating (e.g., the modes are the normal mode, the packed register mode, and the register cascade mode). If the flip-flop 212 is to be synchronously cleared, then the "synchronous clear signal" indicates that the flip-flop 212 is to be synchronously cleared (the "synchronous clear signal" is asserted, e.g., has a logic value "1"). When the "synchronous clear signal" indicates that the flip-flop 212 is to be synchronously cleared, then the output of the NOR gate 227 is a value that clears the flip-flop 212 (the output of the NOR gate 227 is de-asserted, e.g., has the logic value "0"). Since the "synchronous clear signal" indicates that the flip-flop 212 is to be synchronously cleared (the "synchronous clear signal" is asserted, e.g., has a logic value "1"), the output of the OR gate 233 indicates that the LE is to perform a synchronous operation (the output of the OR gate 233 is asserted, e.g., has a logic value "1"). When the flip-flop 212 is to be synchronously cleared, the "synchronous load enable signal" indicates that the LE 203 is to perform a synchronous operation (the "synchronous load enable signal" is asserted, e.g., has a logic value "1"). The output of the OR gate 233 is coupled to a first input of the AND gate 236 and the "synchronous load enable signal" is coupled to the second input of the AND gate 236. When the "synchronous load enable signal" and the output of the OR gate 233 are asserted (e.g., they both have a logic value "1"), the output of the AND gate 236 indicates that the LE 203 is performing a synchronous operation (the output of the AND gate 236 is asserted, e.g., has a logic value "1"). The output of the AND gate 236 is coupled to the control input of the mux 224. Since the output of the AND gate 236 indicates that the LE is performing the synchronous operation, the mux 224 selects as its output the output of the NOR gate 227 (in this embodiment, the mux 224 is programmed such that it selects as its output the output of the NOR gate 227 if the control input of the mux 224 has a logic value "1"). The output of the AND gate 236 is also coupled to the second input of the NOR gate 239. Since the output of the AND gate 236 indicates that the LE is performing a synchronous operation, the output of the NOR gate 239 indicates that the LE 203 is not in the normal mode (the output of the NOR gate 239 is de-asserted, e.g., has the logic value "0"). The output of the NOR gate 239 is coupled to the control input of the mux 230. Since the control input of the mux 230 indicates that the LE 203 is not in the normal mode, the mux 230 selects as its output the output from the mux 224 (in this embodiment, the mux 230 is programmed such that it selects as its output the output of the mux 224 if the control input of the mux 230 has a logic value "0"). When the flip-flop 212 is to be synchronously cleared, the output of the mux 224 is a value that clears the flip-flop 212. In order to clear the flip-flop 212, the output of the mux 230 (the value to clear the flip-flop) is stored in the flip-flop 212.

"synchronous load" synchronously stores the LE input "LEc" in the flip-flop 212. If the flip-flop 212 is to be synchronously loaded, then the "reemerge" signal of FIG. 4 is not asserted. If the flip-flop 212 is to be synchronously loaded, then the "synchronous load signal" indicates that the flip-flop 212 is to be synchronously loaded (the "synchronous load signal" is asserted, e.g., has a logic value "1"). Since the "synchronous load signal" indicates that the flip-flop 212 is to be synchronously loaded, the output of the OR gate 233 indicates that the LE is to perform a synchronous operation (the output of the OR gate 233 is asserted, e.g., has a logic value "1"). When the flip-flop 212 is to be synchronously loaded, the "synchronous load enable signal" indicates that the LE 203 is to perform a synchronous operation (the "synchronous load enable signal" is asserted, e.g., has a logic value "1"). The output of the OR gate 233 is coupled to a first input of the AND gate 236 and the "synchronous load enable signal" is coupled to the second input of the AND gate 236. When the "synchronous load enable signal" and the output of the OR gate 233 are asserted (e.g., they both have a logic value "1"), the output of the AND gate 236 indicates that the LE 203 is performing a synchronous operation (the output of the AND gate 236 is asserted, e.g., has a logic value "1"). The output of the AND gate 236 is coupled to the control input of the mux 224. Since the output of the AND gate 236 indicates that the LE is performing the synchronous operation, the mux 224 selects as its output the output of the NOR gate 227 which is the LE input "LEc". The output of the AND gate 236 is also coupled to the second input of the NOR gate 239. Since the output of the AND gate 236 indicates that the LE is performing a synchronous operation, the output of the NOR gate 239 indicates that the LE 203 is not in the normal mode (the output of the NOR gate 239 is de-asserted, e.g., has the logic value "0"). The output of the NOR gate 239 is coupled to the control input of the mux 230. Since the control input of the mux 230 indicates that the LE 203 is not in the normal mode, the mux 230 selects as its output the output from the mux 224. When the flip-flop 212 is synchronously loaded, the LE input "LEc" is stored in the flip-flop 212. In this embodiment, the flip-flop 212 can be synchronously loaded in the register cascade mode and the normal mode.

One of the many advantage of the cascade chain is that no local line, input pin on the LE, or external routing (e.g., wires in the channel) is used to connect flip-flops of different LEs thus improving the efficiency and decreasing the cost of constructing PLDs that include flip-flops that are connected to each other. Another advantage is that by providing this connection independently of other logic in the LE (e.g., the LUT 209 and the flip-flop 212), a computer-aided design ("CAD") tool can independently choose the locations that the LUTs and flip-flops are placed in the LAB independently of each other.

In another embodiment of the cascade chain, more than one "cascade input data signals" are received at the mux 224 to allow selection from among the multiple "cascade output data signals" from multiple other LEs. In yet another embodiment, the mux 224 and the mux 230 are arranged in a different order, but still allow programmably loading the flip-flop from one of the "cascade input data signal", the LUT 209's output, or one of the LE inputs "LEa", "LEb", "LEc", and "LEd". In another embodiment of the cascade chain, the mux 230 is programmably set such that it always selects the cascade input data signal thus constructing a shift register. In yet another embodiment, in PLDs that provide a scan chain for testing the circuit, the mux 224 may be shared with a scan mux that is used to implement the test circuitry. In another embodiment of the cascade chain, one or more secondary control signals arriving from the synchronous signal processor unit 266 programmably selects the input to the flip-flop 212 within the LE 203 to be one of the "cascade input data signal" or the output of the LUT 209.

In one embodiment, the LE 203 also includes an asynchronous signal selector unit 270 coupled to the flip-flop 212. The asynchronous signal selector unit 270 includes mux 272 and mux 274. One input terminal of mux 272 receives a NCLR0 signal while the other input terminal receives a NCLR1 signal. The NCLR0 and NCLR1 signals are asynchronous clear signals received from the secondary signal generation unit 375 shown in FIG. 4. Similarly, one input terminal of mux 274 is coupled to Vss while the other input terminal is coupled to the ALOAD line, shown in FIG. 4. As shown in FIG. 1, Vss is coupled to ground potential. As can be seen from FIG. 4, if the REN_ALD signal has a logic value "0", then the ALOAD line carries a signal that has a logic value "0". Thus, when REN_ALD signal has a logic value "0", then the ALOAD line is effectively grounded. A signal that is carried on the ALOAD line and has a logic value of "0" may also herein be referred to as a ground potential signal. When the REN_ALD signal does not have a logic value "0", then the ALOAD line receives an ALOAD signal, which is an asynchronous load signal. The control terminals of both mux 272 and mux 274 receive a RCLR1NALD signal. The output terminals of both mux 272 and mux 274 are coupled to the flip-flop 212. More specifically, the output terminal of mux 272 is coupled to an asynchronous clear signal terminal of flip-flop 212 while the output terminal of mux 274 is coupled to an asynchronous load signal terminal of flip-flop 212.

Sharing the RCLR1NALD signal as a control signal for both mux 272 and mux 274 allows saving the memory area required for storing an additional RCLR1NALD bit. Use of one RCLR1NALD signal, rather than two, is feasible because the ALOAD signal is unlikely to be used for a majority of circuits. As the ALOAD signal is unlikely to be used for a majority of circuits, a signal with a logic value "0" is carried on the ALOAD line. This is effectively like coupling the ALOAD line to ground potential, i.e., the Vss terminal, which is coupled to ground potential. In one embodiment, all the ALOAD lines of all the asynchronous signal selector units of a LAB are coupled to ground potential. As both input terminals of mux 274 are effectively grounded, the output signal of mux 274 is independent of the control signal received by mux 274. Consequently, the control terminal of the mux 274 is coupled to the same signal as the control terminal of mux 272 (i.e., the RCLR1NALD signal) to achieve the area saving referred to above.

In one embodiment, if the ALOAD signal is required for any LE in a LAB, then the ALOAD line carries the ALOAD signal. In such a LAB, if an LE wants to access the ALOAD signal, then RCLR1NALD must have a logic value "0" so that the mux 274 selects the ALOAD signal rather than Vss for outputting to flip-flop 212. As the RCLR1NALD signal is set at a logic value "0", then mux 274 selects the signal received on the NCLR0 line. Therefore, the asynchronous clear signal for this LE is routed on the NCLR0 line. On the other hand, if an LE, in a LAB that carries the ALOAD signal, does not want to access the ALOAD signal, then the RCLR1NALD bit is set to a logic value "1". Consequently, the asynchronous clear signal for this LE is routed on the NCLR1 line.

A third aspect of this embodiment pertains to the coupling of a logic gate, such as an exclusive-OR gate 242, to a particular one of the input pins of the LUT 209. By coupling the exclusive-OR gate 242 to the particular one of the input pins, a particular one of the LE inputs destined for that input pin can be inverted under the control of an inversion signal such as an add-or-subtract control signal. By controlling whether the particular one of the LE inputs is inverted, the add-or-subtract control signal may be used to control whether the LE performs the addition operation or the subtraction operation. Within a LE, a first input of the exclusive-OR gate 242 is coupled to the particular one of the LE inputs and a second input of the exclusive-OR gate 242 is coupled to the add-or-subtract control signal. The output of the exclusive-OR gate 242 is coupled to a particular one of the input pins of the LUT 209 that corresponds to the particular one of the LE inputs. In this embodiment, the output of the exclusive-OR gate 242 is coupled to the particular one of the input pins of the LUT 209 that represents the least significant bit to which a carry is sent when performing an arithmetic function. In one embodiment, the add-or-subtract control signal sent to each of the LEs is a common control signal that originates from one single source (i.e., the add-or-subtract control signal sent to each of the LEs has the same value). In this case, one or more of the LEs can programmably enable or disable the add-or-subtract control signal. In another embodiment, each LE may have a separate input multiplexer for the add-or-subtract control signal allowing each LE to have distinct values for the add-or-subtract control signal.

Selection units, such as an output mux 245, an output mux 251, and an output mux 257 select between a combinational output (e.g., output from the LUT 209) and a registered output (e.g., output from the flip-flop 212) to transmit the selected output to local lines or lines outside the LAB (e.g., lines within a channel). A fourth aspect of this embodiment pertains to multiplexers that are adjusted to improve the multiplexing delay when selecting between combinational and registered outputs. Most sequential circuits implemented in PLDs have many levels of combinational logic in the critical path while using only a single registered logic. This characteristic makes it advantageous to improve the speed of the combinational path of the LE even if doing so may degrade the speed of the registered path. This embodiment includes a multiplexer that selects between the combinational and registered outputs of the LE such that the combinational path is selected faster than the registered path.

Figure 2:
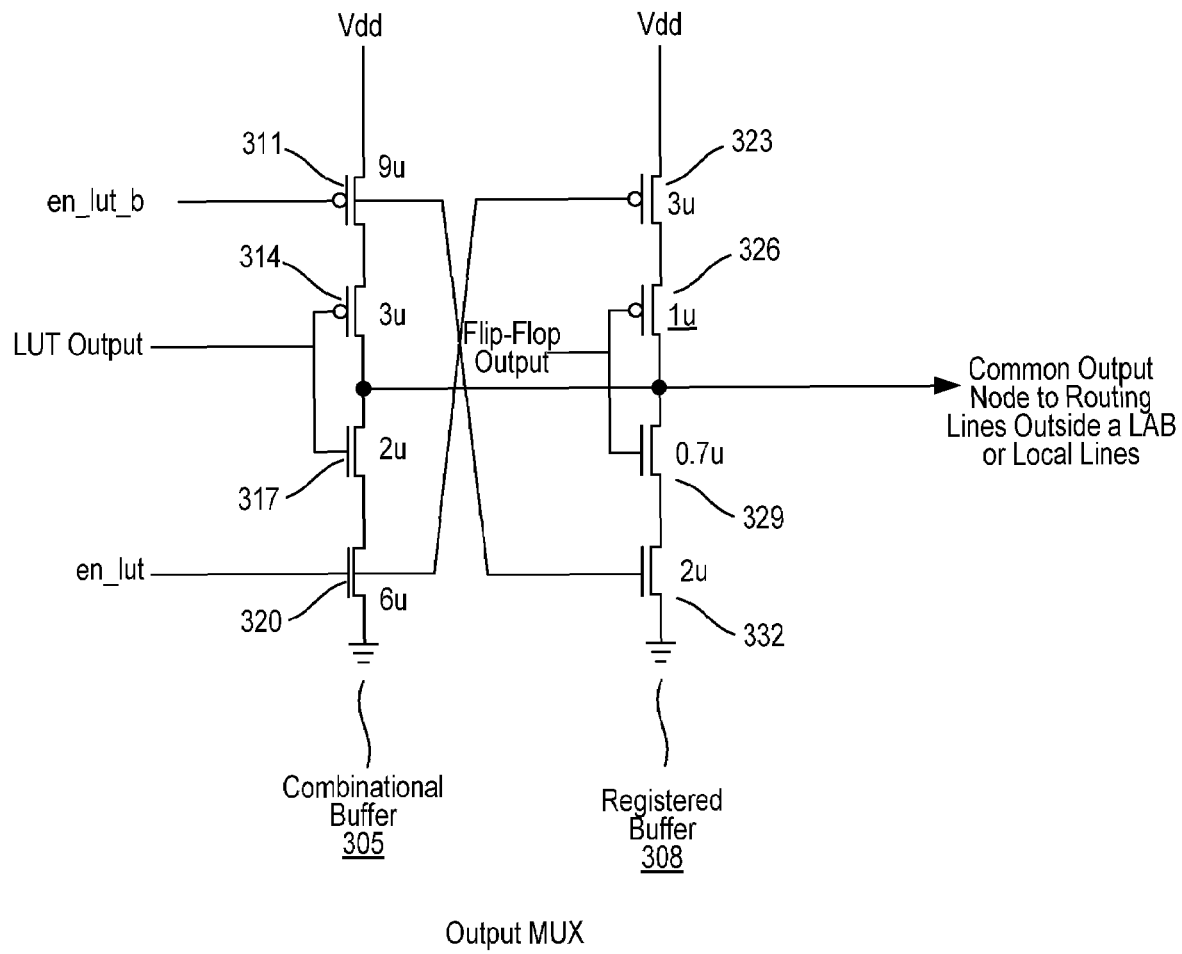
FIG. 2 shows an embodiment of an output multiplexer according to the present invention.

FIG. 2 shows an embodiment of the output multiplexer according to the present invention. The output multiplexer (e.g., the output mux 245, the output mux 251, and the output mux 257) includes a combination buffer 305 and a registered buffer 308. Both buffers have an input from the combinational output of the LE (e.g., the LUT output) and from the registered output of the LE (e.g., the flip-flop output) and a common output node that transmits the selected output to either a LAB line or a local line. The combinational buffer 305 includes a pair of enable transistors, i.e., a transistor 311 and a transistor 320, and the registered buffer 308 also includes a pair of enable transistors, i.e., a transistor 323 and a transistor 332. The combinational buffer 305 includes a pair of drive transistors, i.e., a transistor 314 and a transistor 317, and the registered buffer 308 also includes a pair of drive transistors, i.e., a transistor 326 and a transistor 329. In this embodiment, the transistor 311 and the transistor 323 are p-channel metal-oxide semiconductor ("PMOS") transistors and the transistor 320 and the transistor 332 are n-channel metal-oxide semiconductor ("NMOS") transistors.

For the combinational buffer 305, a source of the transistor 311 is coupled to a voltage supply $V_{dd}$ and a source of the transistor 320 is coupled to a ground. A drain of the transistor 311 is coupled to a source of the transistor 314. A gate of the transistor 314 and a gate of the transistor 317 are coupled to the output of the LUT 209. The common output node is coupled to the drains of the transistor 314 and the transistor 317. The drain of the transistor 314 is coupled to the drain of the transistor 317. The drain of the transistor 320 is coupled to the source of the transistor 317.

For the registered buffer 308, a source of the transistor 323 is coupled to a voltage supply $V_{dd}$ and a source of the transistor 332 is coupled to a ground. A drain of the transistor 323 is coupled to a source of the transistor 326. A gate of the transistor 326 and a gate of the transistor 329 are coupled to the output of the flip-flop 212. The common output node is coupled to the drains of the transistor 326 and the transistor 329. The drain of the transistor 326 is coupled to the drain of the transistor 329. The drain of the transistor 332 is coupled to the source of the transistor 329.

By choosing the size of the enable transistors (e.g., the transistor 311, the transistor 320, the transistor 323, and the transistor 332) to be sufficiently larger than the size of the drive transistors (e.g., the transistor 314, the transistor 317, the transistor 326, and the transistor 329), the electrical behavior (including the input and output capacitance and delay) of the combinational buffer 305 can be adjusted to be close to that of a single buffer (e.g., a buffer 248, a buffer 254, and a buffer 260) thus allowing the multiplexing delay to be absorbed by the delay used to buffer the output signal. The sizes of the registered buffer 308 and the combinational buffer 305 are chosen such that the transistors of the combinational buffer 305 are larger than the corresponding transistors of the registered buffer 308 (e.g., the transistor 311 has a larger size than the corresponding transistor 323, and the transistor 314 has a larger size than the corresponding transistor 326) so that the drive transistors of the registered buffer 308 provide a small diffusion capacitance on the common output node of the output mux. Since the transistors of the combinational buffer 305 are larger than the transistors of the registered buffer 308, the output of the LUT 209 is driven to the common output node at a faster rate than the output of the flip-flop 212. The sizes of the transistors of the combinational buffer 305 and the registered buffer 308 shown in FIG. 2 are exemplary and may be adjusted based on the sequential circuit implemented. Considerations used in determining the transistor sizes include the number of combinational logic stages in a sequential circuit and the area cost versus delay tradeoff in the relative sizes of the enable transistors compared to the drive transistors.

A fifth aspect of this embodiment pertains to the efficient grouping of the LAB lines and local lines. In this embodiment, multiple groups of LAB lines and local lines programmably connect to the input pins of the LEs and there are more such unique groups of LE lines than the minimum that provide connectivity to all of the input pins of the LE. For example, if each of the LAB lines connect to 50% of the input pins of the LE, and the LE has 4 input pins labeled "LEa", "LEb", "LEc", and "LEd", then the minimum number of distinct groups of LE input pins would be two groups. The two groups of lines are such that each line in one of the groups connect to pin A and pin C on any of the LEs, and each line in the other group connect to pin B and pin D on any of the LEs. The exact choice of pins may be determined by the logical equivalence of the pins on the LE, and the need to balance the number of signals that can reach each distinct type of pin on the LE. For example, when an LE operates in arithmetic mode, only pins A and B may be used since the two operands arrive at pins A and B, so pins A and B should be in different groups so as to provide separate lines to both pin A and pin B of every LE. In this embodiment, the number of groups of logically equivalent LAB lines and local lines is increased beyond this minimal number of two groups.

Figure 3:
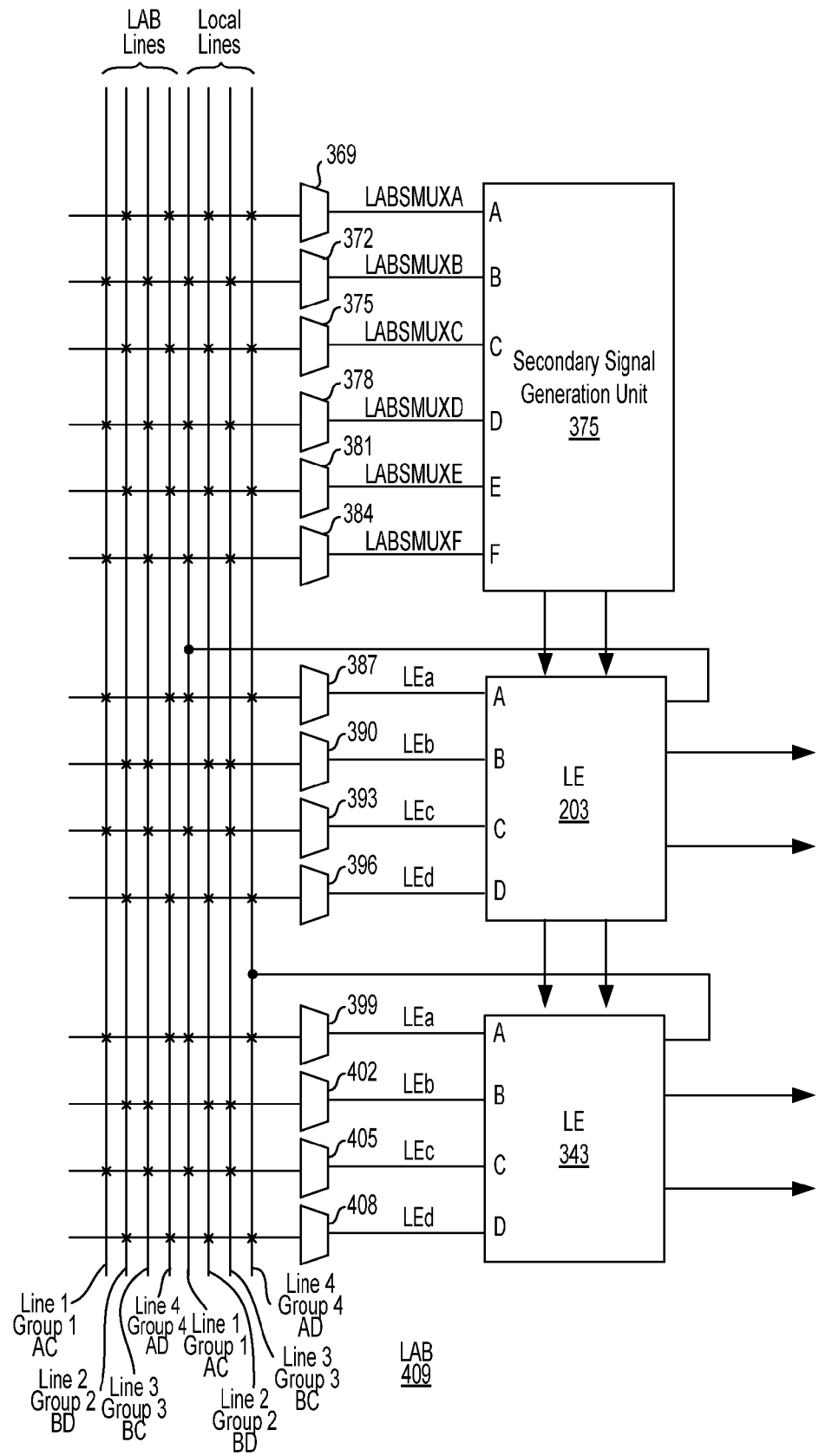
FIG. 3 shows an example of an embodiment of the routing patterns according to the present invention.

FIG. 3 shows an example of an embodiment of the routing patterns within a LAB 409 according to the present invention. In this example, four separate groups of LAB lines and local lines are used. In a first group, each of the routing lines of the group are coupled to the input pins "A" and "C" of the LE 203 and the LE 343. In a second group, each of the routing lines of the group are coupled to input pins "B" and "D" of the LE 203 and the LE 343. In a third group, each of the routing lines of the group are coupled to input pins "B" and "C" of the LE 203 and the LE 343. In a fourth group, each of the routing lines of the group are coupled to input pins "A" and "D" of the LE 203 and the LE 343. In this example, the first group and the second group are a minimum number of groups that provide connection to all of the input pins of each LE. Here, more groups than this minimum number are provided (e.g., the third group and the fourth group are also provided) in order to increase routing flexibility.

In FIG. 3, a LEIM 387 provides the LE input "LEa" to the input pin "A" of the LE 203. A LEIM 390 provides the LE input "LEb" to the input pin "B" of the LE 203. A LEIM 393 provides the LE input "LEc" to the input pin "C" of the LE 203. A LEIM 396 provides the LE input "LEd" to the input pin "D" of the LE 203. A LEIM 399 provides the LE input "LEa" to the input pin "A" of the LE 343. A LEIM 402 provides the LE input "LEb" to the input pin "B" of the LE 343. A LEIM 405 provides the LE input "LEc" to the input pin "C" of the LE 343. A LEIM 408 provides the LE input "LEd" to the input pin "D" of the LE 343.

In this embodiment, each of the LEIMs selects from a set of routing lines and the routing lines are divided into several groups of equivalent lines, each group having the same pattern of connections between each of the routing lines within that group and a subset of the LE input pins. In this embodiment, there are more such distinct groups of routing lines than the minimum number of groups to connect to each of the LE input pins. In general, providing more than the minimum number of groups of routing lines increases the routing flexibility by decreasing the likelihood of contention, however, having more routing lines increases the number of metal lines used within the LAB and may increase the physical area occupied by the PLD. Thus, increasing the number of groups should be balanced with the associated cost resulting from the increased number of routing lines used.

One attribute of the fifth aspect of this embodiment is that the connectivity between a subset of the LAB lines and a particular one of the input pins of the LE is the same for all LEs in the LAB. This means that the LEs are logically equivalent and a CAD tool is free to assign a location to a LE in the LAB provided that no other constraints (such as carry chains) force the LE to a given position. This ability to choose a position increases the routing flexibility by effectively providing access to all of the output routing resources for each LE. In another embodiment, the LAB lines are coupled to a subset of the input pins of a LE as described earlier (e.g., having more distinct groups than the minimum number of groups), however, the local lines are fully populated (e.g., each of the local lines are coupled to each of the inputs of the LE). The 50% population of the routing lines shown in FIG. 3 are for example purposes only and the degree of population of the routing lines can vary.

A secondary signal generation unit 375 provides the secondary signals used by the LE 203 and is constructed to operate efficiently with the routing pattern shown in FIG. 3. The secondary signals provided by the secondary signal generation unit 375 include the "add-or-subtract control signal", the "synchronous clear signal", and the "synchronous load signal" shown in FIG. 1. These secondary signals produced by the secondary signal generation unit 375 are sent to all of the LEs within the LAB. FIG. 4 shows an embodiment of the secondary signal generation unit 375 according to the present invention. The secondary signal generation unit 375 includes a group of "2:1" signal selection multiplexers to programmably select between the outputs of a pair of LEIMs. In this embodiment, there are six outputs from six different LEIMs and these outputs are labeled LABSMUXA, LABSMUXB, LABSMUXC, LABSMUXD, LABSMUXE, and LABSMUXF. The group of "2:1" signal selection multiplexers include a signal selection mux 430, a signal selection mux 433, a signal selection mux 436, a signal selection mux 439, a signal selection mux 442, a signal selection mux 445, a signal selection mux 448, and a signal selection mux 451. One signal selection multiplexer is provided for each of the eight secondary signals generated by the secondary signal generation unit 375. The outputs of the LEIMs (e.g., LABSMUXA and LABSMUXB) coupled to the inputs of a particular one of the signal selection multiplexers are chosen such that the signal selection multiplexer has access to all of the LAB lines or local lines. For example, in FIG. 4, the signal selection mux 433 has as its inputs the signals LABSMUXA and LABSMUXB. As shown in FIG. 3, the LEIM 369 (the LEIM 369 produces as its output the LABSMUXA signal) is coupled to LAB lines 2 and 4 and local lines 2 and 4 and the LEIM 372 (the LEIM 372 produces as its output the LABSMUXB signal) is coupled to LAB lines 1 and 3 and local lines 1 and 3. Thus, the signal selection mux 433, which receives the signals LABSMUXA and LABSMUXB, has access to all the routing lines.

The secondary signal generation unit 375 includes a clock generation unit 454 that produces a "CLK0" signal and a clock generation unit 457 that produces a "CLK1" signal. The "CLK0" signal and the "CLK1" signal are generated using a "clk" signal and a "clken" signal. The "CLK0" signal or the "CLK1" signal is coupled to the clock input terminal of flip-flop 212. The "CLK0" or the "CLK1" signal causes, for example, the flip-flop 212 to load data on the rising edge of the "clk" signal if the "clken" signal is high (e.g., has a logic value "1") during the rising edge. Not all of the secondary signals generated by the secondary signal generation unit 375 may be used in every LAB. In this embodiment, the routing flexibility is increased by providing a connection pattern between the LABSMUX signals and the signal selection multiplexers that provide routing flexibility when not all secondary signals are used by the LEs. For example, the clock generation unit 454 and the clock generation unit 457 are provided the "clk" signal (e.g., the "clk" signal is the output of the signal selection mux 433 and the output of the signal selection mux 439), and also the "clken" signal (e.g., the "clken" signal is the output of the signal selection mux 436 and the output of the signal selection mux 442). The LABSMUX signals that are provided to each of the signal selection muxes are distinct. For example, the clock generation unit 454 uses the LABSMUXA signal and the LABSMUXB signal for the "clk" signal and uses the LABSMUXC signal and the LABSMUXD signal for the "clken" signal. The LABSMUXA signal is carried on a first subset of the routing lines, i.e., the routing lines 2 and 4. The LABSMUXB signal is carried on a second subset of the routing lines, i.e., the routing lines 1 and 3. The first subset of the routing lines is distinct from the second subset of the routing lines. The LABSMUXC signal is carried on a third subset of the routing lines, i.e., the routing lines 2 and 4. The LABSMUXD signal is carried on a fourth subset of the routing lines, i.e., the routing lines 1 and 3. The third subset of the routing lines is distinct from the fourth subset of the routing lines. The clock generation unit 457 uses the LABSMUXC signal and the LABSMUXD signal for the "clk" signal and uses the LABSMUXA signal and the LABSMUXB signal for the "clken" signal.

As noted above, the LABSMUXC signal and the LABSMUXD signal are carried on the third subset of the routing lines (i.e., the routing lines 2 and 4) and the fourth subset of the routing lines (i.e., the routing lines 1 and 3), respectively. As stated earlier, the third subset of the routing lines is distinct from the fourth subset of the routing lines. As also noted above, the LABSMUXA signal and the LABSMUXB signal are carried on the first subset of the routing lines (i.e., the routing lines 2 and 4) and the second subset of the routing lines (i.e., the routing lines 1 and 3), respectively. As also stated above, the first subset of the routing lines is distinct from the second subset of the routing lines. Using this routing, when only a single clock generation unit is used within the LAB, that clock generation unit can access all four of the LABSMUX signals (e.g., the signals LABSMUXA, LABSMUXB, LABSMUXC, and LABSMUXD) which increases the number of routing choices available to the clock generation unit.

If both the "clk" signal and the "clken" signal enter the LAB 409 on the LAB lines or local lines, then the "clk" signal is selected from only half the LAB lines or local lines and the "clken" signal is selected from the other half of the LAB lines or local lines. To overcome this constraint, in another embodiment, the "clk" signal is routed on a global clock signal line LABCLK[0..7] and in this case, the "clk" signal is not carried on a LAB line thus giving the "clken" signal unconstrained access to both LEIMs (e.g., the "clken" signal can be carried on any of the LAB lines 1-4). In this embodiment, using the mux 434, the clock generation unit 454 can use either the global clock signal LABCLK[0..7] or the clock signal provided by the output of the signal selection mux 433. If the global clock signal is used, then any one of the LAB lines 1-4 can be used to carry the "clken" signal to the clock generation unit 454 using the signal selection mux 436. The clock generation unit 457 can also use either the global clock signal or the clock signal provided by the output of the signal selection mux 439. If the global clock signal is used, then any one of the LAB lines 1-4 can be used to carry the "clken" signal to the clock generation unit 457 using the signal selection mux 442.

The secondary signal generation unit 375 also includes a clear generation unit 460 and a clear generation unit 463, which produce the two asynchronous clear signals "NCLR0" and "NCLR1", respectively. The signal selection mux 445 and the signal selection mux 448 are coupled to a common pair of LABSMUX signals (i.e., the LABSMUXE signal and the LABSMUXF signal) so that when only a single asynchronous clear signal is used by the LEs, the particular one of the clear generation units can access either of those LABSMUX signals. As shown in FIG. 3, the LABSMUXE signal is carried on the first subset of the routing lines, i.e., the routing lines 2 and 4. As also shown in FIG. 3, the LABSMUXF signal is carried on the second subset of the routing lines, i.e., the routing lines 1 and 3. The first subset of the routing lines is distinct from the second subset of the routing lines. The secondary signal generation unit 375 also includes a clear generation unit 464 that produces a "synchronous clear signal". The "synchronous clear signal" is less likely to be used if both asynchronous clear signals are used. Thus, the signal selection mux 451 of the clear generation unit 464 is coupled to the same pair of LABSMUX signals as the signal selection mux 445 of the clear generation unit 460 and the signal selection mux 448 of the clear generation unit 463.

Figure 5:
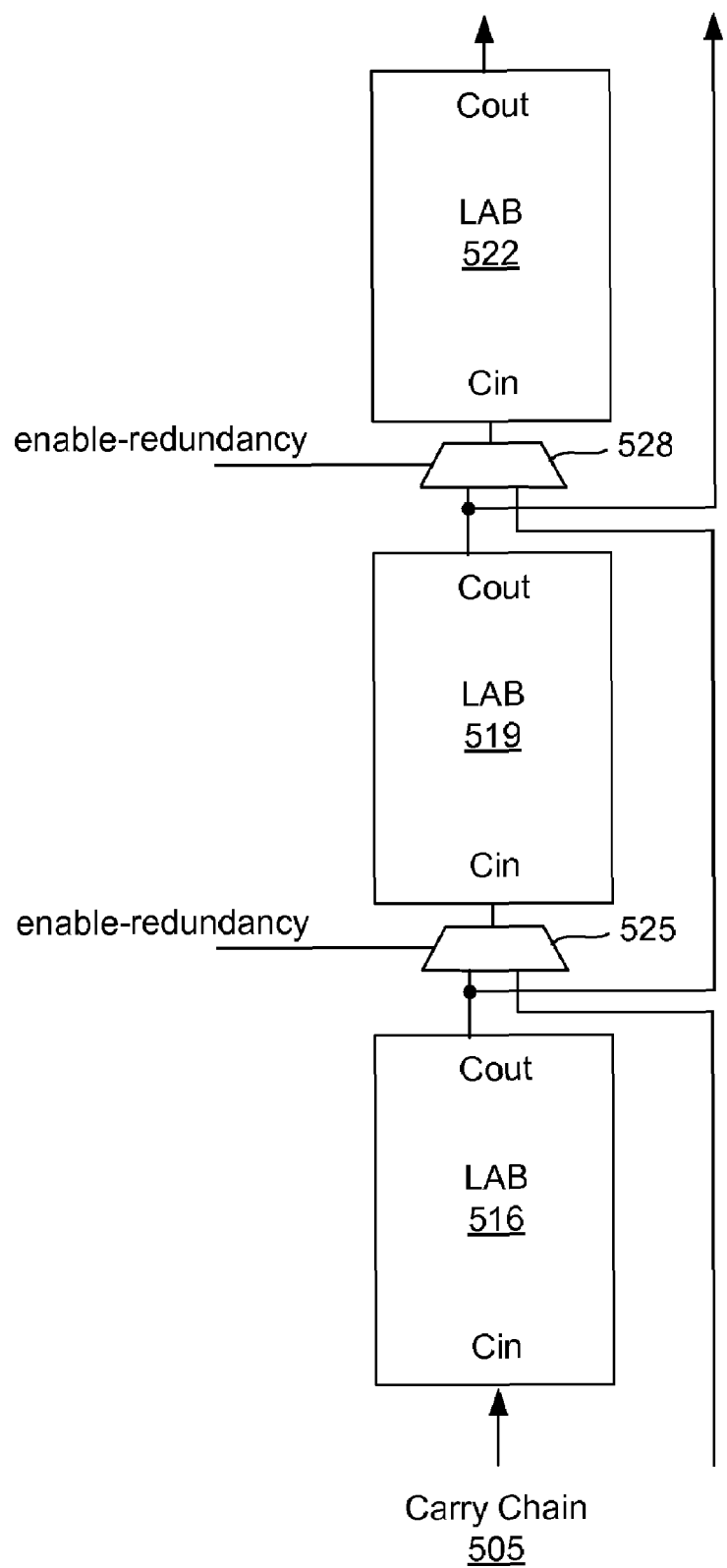
FIG. 5 shows an embodiment of a carry chain according to the present invention.

A sixth aspect of this embodiment pertains to a carry chain 505 that supports redundancy within the PLD. FIG. 5 shows an embodiment of the carry chain 505 according to the present invention. The carry chain 505 includes multiple LABs in either a column or row of LABs and each LAB of the carry chain supports the carry function and the carry chain runs in the same direction as the direction that logic is shifted when redundancy is engaged. The carry chain 505 includes a LAB 516, a LAB 519, and a LAB 522. Each of the these LABs is coupled to a multiplexer (e.g., a mux 525 and a mux 528) that is controlled by the "enable-redundancy" signal. In one embodiment, mux 525 is included in LAB 519, and mux 528 is included in LAB 522. The "enable redundancy" signal indicates whether redundancy is engaged at a particular row or column that is directly adjacent in the direction that logic is shifted if redundancy is engaged. If redundancy is engaged at a particular row or column, then the multiplexer corresponding to a particular one of the functional LABs within the carry chain 505 selects its output (the output of the multiplexer is coupled to the "Cin" of that LAB) to be one of the multiple inputs to the multiplexer that is from a functional LAB (e.g., a functional LAB is a LAB not in the defective row or column). For example, in FIG. 5, assume that row redundancy is implemented and that logic is shifted in the downward direction when redundancy is enabled and that the LAB 519 is defective, then the "enable-redundancy" signal is asserted for the mux 528 to indicate that the LAB 519 is defective and therefore the output of the LAB 516 is selected as the input to the mux 528 rather than the output of the LAB 519, which is defective.

Figure 6:
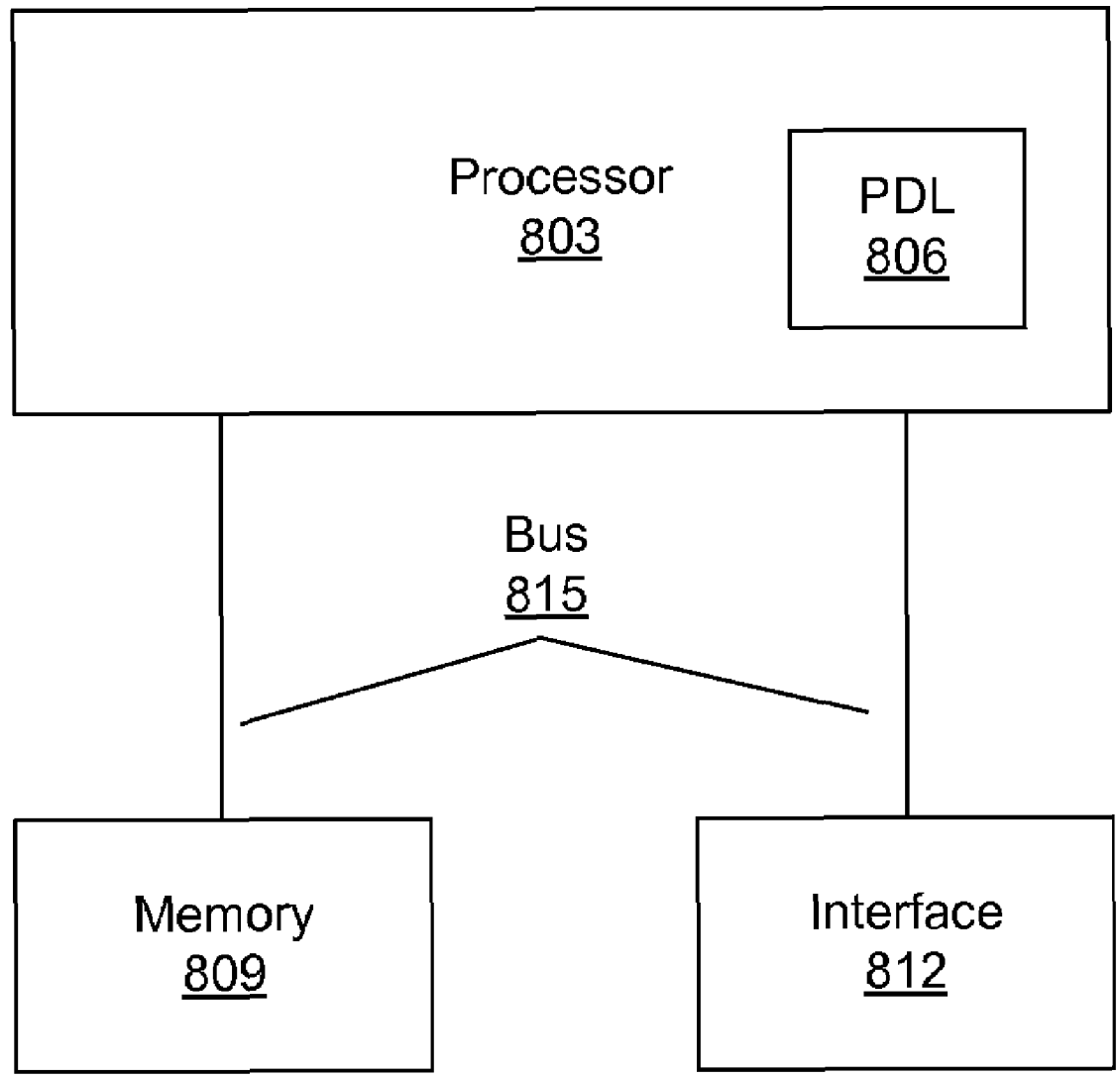
FIG. 6 shows an electronic system that includes a PLD according to an embodiment of the present invention.

A PLD or PLDs according to the present invention may be included in a processor that is part of an electronic system. The electronic system may be a digital computing system such as a general or special purpose computer, or a specialized digital switching network, or other processing system. FIG. 6 shows an electronic system 801 that includes a PLD 806 according to an embodiment of the present invention. In FIG. 6, a processor 803 is coupled to a memory 809 and an interface 812 using a bus 815. The processor 803 may be used to configure the PLD 806. The PLD 806 may serve different purposes within the processor 803. For example, the PLD 806 may be a logical building block of the processor 803 supporting its internal and external operations.

The memory 809 stores information such as source code. This source code may be compiled into machine language and executed by the processor 803. The memory 809 may also store configuration data for programming the PLD 806. The interface 812 provides data to the processor 803 or receives data from the processor 803. For example, a user may input, using the interface 812, logical functions to be programmed into the PLD 806. The bus 815 transfers data between the processor 803, the memory 809, and the interface 812.

While the present invention has been particularly described with respect to the illustrated embodiments, it will be appreciated that various alterations, modifications and adaptations may be based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the claims.

What is claimed is:

1. A programmable logic device, comprising:
a plurality of logic array blocks arranged in an array, one of the logic array blocks in the array including:
   a first subset of a plurality of routing lines, each of the first subset of the plurality of routing lines coupled to a first subset of a plurality of input pins of a logic element to produce at least one connection on each one of the first subset of the plurality of routing lines; and
   a second subset of the plurality of routing lines, each of the second subset of the plurality of routing lines coupled to a second subset of the plurality of input pins of the logic element to produce at least one connection on each one of the second subset of the plurality of routing lines;
   wherein the at least one connection of each of the first subset of the plurality of routing lines is distinct from connections of other ones of the first subset of the plurality of routing lines and connections of the first subset of the plurality of routing lines together provide connections to all of the plurality of input pins, and the at least one connection of each of the second subset of the plurality of routing lines is distinct from the at least one connection of each of the first subset of the plurality of routing lines.

2. The programmable logic device of claim 1, wherein the routing lines are logic array block lines or local lines in the one logic array block.

3. The programmable logic device of claim 1, wherein the one logic array block includes a secondary signal generation unit configured to generate one or more secondary signals.

4. The programmable logic device of claim 3, wherein the one or more secondary signals includes: one or more clock signals and/or one or more clear signals.

5. The programmable logic of claim 3, wherein the secondary signal generation unit further comprises:
   a first selection unit comprising a first input terminal, a second input terminal and an output terminal, the first input terminal coupled to the first subset of a plurality of routing lines and the second input terminal coupled to the second subset of the plurality of routing lines;
   a second selection unit having a first input terminal, a second input terminal, and an output terminal, the first input terminal of the second selection unit coupled to the third subset of the plurality of routing lines and the second input terminal of the second selection unit coupled to a fourth subset of the plurality of routing lines; and
   a clock generation unit having a first input terminal, a second input terminal, and an output terminal, the first input terminal of the clock generation unit coupled to the output terminal of the first selection unit, the second input terminal of the clock generation unit coupled to the output terminal of the second selection unit, and an output of the clock generation unit is a resulting clock signal,
   wherein each of the first subset of the plurality of routing lines is different than each of the second subset of the plurality of routing lines and the first selection unit selects as its output signal a signal carried on a particular one of the first subset of the plurality of routing lines and the second subset of the plurality of routing lines that is a clock signal, and
   each of the third subset of the plurality of routing lines is different than each of the fourth subset of the plurality of routing lines and the second selection unit selects as its output signal a signal carried on a particular one of the third subset of the plurality of routing lines and the fourth subset of the plurality of routing lines that is a clock enable signal.

6. The programmable logic device of claim 5, wherein the first subset of the plurality of routing lines and the second subset of the plurality of routing lines together comprise all of the plurality of routing lines, and the third subset of the plurality of routing lines and the fourth subset of the plurality of routing lines together comprise all of the plurality of routing lines.

7. The logic array block of claim 5, wherein the first selection unit comprises a first multiplexer and the second selection unit comprises a second multiplexer.

8. The programmable logic device of claim 3, wherein the secondary signal generation unit further comprises:
   a selection unit comprising a first input terminal, a second input terminal, and an output terminal, the first input terminal coupled to the first subset of a plurality of routing lines and the second input terminal coupled to the second subset of the plurality of routing lines;
   a clock generation unit having a first input terminal, a second input terminal, and an output terminal, the first input terminal of the clock generation unit coupled to the output terminal of the selection unit, the second input terminal of the clock generation unit coupled to a global clock signal, and an output signal of the clock generation unit is a resulting clock signal,
   wherein each of the first subset of the plurality of routing lines is different than each of the second subset of the plurality of routing lines and the selection unit selects as its output signal a signal carried on a particular one of the first subset of the plurality of routing lines and the second subset of the plurality of routing lines that is a clock enable signal.

9. The programmable logic device of claim 8, wherein the first subset of the plurality of routing lines and the second subset of the plurality of routing lines together comprise all of the plurality of routing lines.

10. The logic array block of claim 8, wherein the selection unit comprises a multiplexer.

11. The programmable logic device of claim 8, wherein the secondary signal generation unit further comprises:
   a first clear generation unit comprising a first input terminal, a second input terminal, and an output terminal, the first input terminal coupled to the first subset of a plurality of routing lines, the second input terminal coupled to the second subset of the plurality of routing lines, and an output signal of the first clear generation unit is a first asynchronous signal;
a second clear generation unit comprising a first input terminal, a second input terminal, and an output terminal, the first input terminal of the second clear generation unit coupled to the first subset of the plurality of routing lines, the second input terminal of the second clear generation unit coupled to the second subset of the plurality of routing lines, and an output signal of the second clear generation unit is a second asynchronous signal; and
a third clear generation unit comprising a first input terminal, a second input terminal, and an output terminal, the first input terminal of the third clear generation unit coupled to the first subset of the plurality of routing lines, the second input terminal of the third clear generation unit coupled to the second subset of the plurality of routing lines, and an output signal of the third clear generation unit is a synchronous clear signal,
wherein each of the first subset of the plurality of routing lines is different than each of the second subset of the plurality of routing lines.

12. The programmable logic device of claim 11, wherein the first subset of the plurality of routing lines and the second subset of the plurality of routing lines together comprise all of the plurality of routing lines.

13. A programmable logic device, comprising:
a plurality of logic array blocks arranged in an array, one of the logic away blocks in the array including:
a first logic element (LE) including a first input pin, a second input pin, a third input pin and a fourth input pin;
a second logic element (LE) including a fifth input pin, a sixth input pin, a seventh input pin and an eighth input pin;
a first group of routing lines, each of the first group of routing lines coupled with the first input pin, the third input pin, the fifth input pin and the seventh input pin;
a second group of routing lines, each of the second group of routing lines coupled with the second input pin, the fourth input pin, the sixth input pin and the eighth input pin; and
a third group of routing lines, each of the third group of routing lines coupled with the second input pin, the third input pin, the sixth input pin and the seventh input pin.

14. The programmable device of claim 13, wherein the programmable logic device further comprises a fourth group of routing lines, each of the fourth group of routing lines coupled with the first input pin, the fourth input pin, the fifth input pin and the eighth input pin.

* * * * *